(12) United States Patent
Hsu et al.

(10) Patent No.: US 11,646,264 B2
(45) Date of Patent: May 9, 2023

(54) SEMICONDUCTOR STRUCTURE WITH SUPER VIA AND MANUFACTURING METHOD THEREOF

(71) Applicant: UNITED MICROELECTRONICS CORP., Hsin-Chu (TW)

(72) Inventors: Min-Shiang Hsu, Kaohsiung (TW); Yu-Han Tsai, Kaohsiung (TW); Chih-Sheng Chang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 185 days.

(21) Appl. No.: 17/168,099

(22) Filed: Feb. 4, 2021

(65) Prior Publication Data
US 2022/0216144 A1 Jul. 7, 2022

(30) Foreign Application Priority Data
Jan. 6, 2021 (CN) .......................... 202110011434.1

(51) Int. Cl.
*H01L 23/522* (2006.01)
*H01L 21/768* (2006.01)
*H01L 23/528* (2006.01)
*H01L 21/033* (2006.01)

(52) U.S. Cl.
CPC ...... *H01L 23/5226* (2013.01); *H01L 21/0332* (2013.01); *H01L 21/7684* (2013.01); *H01L 21/76816* (2013.01); *H01L 21/76832* (2013.01); *H01L 21/76879* (2013.01); *H01L 21/76897* (2013.01); *H01L 23/5283* (2013.01)

(58) Field of Classification Search
CPC ............ H01L 23/5226; H01L 23/5283; H01L 21/0332; H01L 21/76816; H01L 21/76832; H01L 21/7684; H01L 21/76879; H01L 21/76897
See application file for complete search history.

(56) References Cited

U.S. PATENT DOCUMENTS

| | | |
|---|---|---|
| 10,020,254 B1 | 7/2018 | Bao |
| 10,020,255 B1 | 7/2018 | Bao |
| 10,026,687 B1 | 7/2018 | Lin |
| 10,319,629 B1 * | 6/2019 | Yang ................. H01L 21/76831 |
| 10,573,593 B2 | 2/2020 | Lin |
| 2008/0085606 A1 * | 4/2008 | Fischer ............. H01L 21/31144 438/736 |

* cited by examiner

*Primary Examiner* — Shahed Ahmed
*Assistant Examiner* — Vicki B. Booker
(74) *Attorney, Agent, or Firm* — Winston Hsu

(57) ABSTRACT

The invention provides a semiconductor structure. The semiconductor structure includes a substrate, a first inter metal dielectric (IMD) layer, a second inter metal dielectric layer and a third inter metal dielectric layer sequentially arranged on the substrate. The first inter metal dielectric layer includes at least one first wire, the second inter metal dielectric layer includes at least one mask layer, and the third inter metal dielectric layer includes at least one third wire and a super via. The super via penetrates through the second inter metal dielectric layer, and electrically connect to the first wire and the third wire, and part of the super via directly contacts the mask layer in the second inter metal dielectric layer.

17 Claims, 6 Drawing Sheets

SEMICONDUCTOR STRUCTURE WITH SUPER VIA AND MANUFACTURING METHOD THEREOF

BACKGROUND OF THE INVENTION

1. Field of the Invention

The present invention relates to the field of semiconductor manufacturing processes, in particular to a semiconductor structure including a super via and a manufacturing method thereof.

2. Description of the Prior Art

A via is an electrical connection between wiring structures (e.g., wiring layers) in a physical electronic circuit that goes through the plane of one or more adjacent layers. For example, in integrated circuit design, a via is a small opening in an insulating oxide layer that allows a conductive connection between different wiring layers. A via connecting the lowest layer of metal to diffusion or poly is typically called a "contact".

In via technology, a super via, also known as a skip via, can be formed through many insulator layers, e.g., bypassing one or more wiring structures within the insulator layers, to connect with a lower wiring structure. This provides improved resistance characteristics, minimizes capacitance for a lower wiring structure, e.g., at M0 layer, as well as provides area efficiencies in the chip manufacturing process.

SUMMARY OF THE INVENTION

The invention provides a semiconductor structure, which comprises a substrate, a first inter-metal dielectric layer, a second inter-metal dielectric layer and a third inter-metal dielectric layer sequentially arranged on the substrate, the first inter-metal dielectric layer comprises at least one first conductive layer, the second inter-metal dielectric layer comprises at least one mask layer, and the third inter-metal dielectric layer comprises at least one third conductive layer and a super via penetrates through the second inter-metal dielectric layer, and electrically connected to the first conductive layer and the third conductive layer, and part of the super via directly contact the mask layer in the second inter-metal dielectric layer.

The invention also provides a manufacturing method of a semiconductor structure, which comprises the following steps: firstly, providing a substrate, and then sequentially forming a first inter-metal dielectric layer, a second inter-metal dielectric layer and a third inter-metal dielectric layer on the substrate, the first inter-metal dielectric layer contains at least a first conductive layer and the second inter-metal dielectric layer contains at least a mask layer. The third inter-metal dielectric layer at least includes at least a third conductive layer, and a super via is formed to penetrate through the second inter-metal dielectric layer and electrically connect the first conductive layer and the third conductive layer, and part of the super via directly contacts the mask layer in the second inter-metal dielectric layer.

The invention provides a semiconductor structure with a super via and a manufacturing method thereof. The semiconductor structure formed by the process of the invention includes a super via which is electrically connected with wire layers or conductive structures of upper and lower inter-metal dielectrics, and skips the wire layer or conductive structure of at least one inter-metal dielectric layer in the middle (for example, electrically connecting the first conductive layer of the first inter-metal dielectric layer M1 with the third conductive layer of the third inter-metal dielectric layer M3, while skipping the second inter-metal dielectric layer M2) In addition, the super via formed by self-alignment includes at least one mask layer contacting the super via in the middle section, which can be used as a supporting structure and can avoid the problems of atom diffusion and poor alignment. Therefore, the semiconductor structure with super vias and the manufacturing method thereof provided by the present invention have better device quality and process yield.

These and other objectives of the present invention will no doubt become obvious to those of ordinary skill in the art after reading the following detailed description of the preferred embodiment that is illustrated in the various Figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the Figures are only for illustration and the Figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
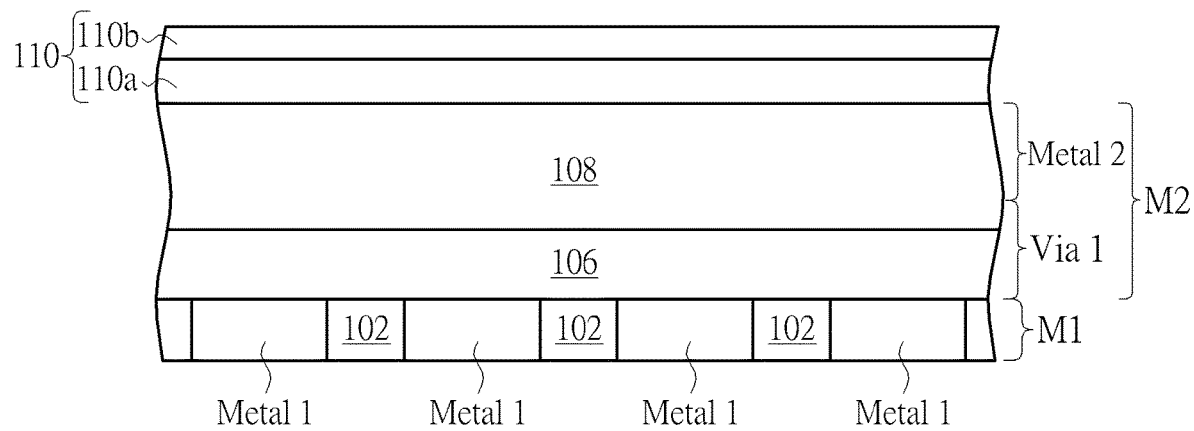
FIG. 1 to FIG. 10 show schematic diagrams of semiconductor structures fabricated according to the first preferred embodiment of the present invention.

Please refer to FIG. 1 to FIG. 10, which show schematic diagrams of semiconductor structures fabricated according to the first preferred embodiment of the present invention. First, as shown in FIG. 1, a first inter-metal dielectric layer M1 is provided, wherein the first inter-metal dielectric layer M1 includes a dielectric layer 102 and a first conductive layer Metal 1 located in the dielectric layer 102. The dielectric layer 102 is an insulating material, such as silicon oxide, silicon nitride, silicon oxynitride, etc., and the first conductive layer Metal 1 is a wire layer, which is made of metal or other materials with good conductivity, such as tungsten, cobalt, copper, aluminum, etc., but not limited to this. The first conductive layer Metal 1 and the dielectric layer 102 are collectively referred to as a first inter-metal dielectric layer M1, which may be one of a plurality of inter-metal dielectric layers (IMD) stacked on each other in a semiconductor structure, and other inter-metal dielectric layers may be formed above the first inter-metal dielectric layer M1 in subsequent steps, which will be described in subsequent paragraphs.

A top surface of the first conductive layer Metal 1 is exposed by the dielectric layer 102 (that is, the dielectric layer 102 does not cover the first conductive layer Metal 1), so other contact or vias formed later can be electrically connected with the first conductive layer Metal 1. In addition, the first conductive layer Metal 1 may be electrically connected with other devices (such as transistors) below, but for the sake of simplicity, other devices below are not depicted here.

With continued reference to FIG. 1, an etching stop layer 106 and a low-k dielectric layer 108 are sequentially formed on the dielectric layer 102 and the first conductive layer Metal 1. The etching stop layer 106 is made of, for example, SiCN, SiOC, AlN, etc., and the low-k dielectric layer 108 is made of a material with a dielectric coefficient lower than 3, but is not limited to this. Then, a second conductive layer (Metal 2) and a via structure (Via 1) are formed in the low-k dielectric layer 108 and the etching stop layer 106. It is worth noting that the second conductive layer Metal 2 and via structure Via 1 are not shown in FIG. 1 because the sectional view in FIG. 1 does not pass through the second conductive layer Metal 2 and via structure Via 1. However, the second conductive layer Metal 2 is located in the low-k dielectric layer 108, near the top region of the low-k dielectric layer 108 and arranged parallel to the direction of the first conductive layer Metal 1, while the via structure Via 1 may be located in the lower half of the low-k dielectric layer 108 and the etching stop layer 106, and electrically connects the first conductive layer Metal 1 and the second conductive layer Metal 2. The second conductive layer Metal 2, the via structure Via 1 and part of the low-k dielectric layer 108 can be combined and defined as the second inter-metal dielectric layer M2. The second inter-metal dielectric layer M2 is located on the first inter-metal dielectric layer M1, and the second inter-metal dielectric layer M2 can be one of a plurality of inter-metal dielectric layers (IMD) stacked on each other in the semiconductor structure.

After the second inter-metal dielectric layer M2 is formed, a double mask layer 110 is formed on the second inter-metal dielectric layer M2. The double mask layer 110 in this embodiment includes a lower mask layer 110a and an upper mask layer 110b, the lower mask layer 110a and the upper mask layer 110b are made of different materials, and the two materials have sufficient etching selectivity. For example, in this embodiment, the lower mask layer 110a is made of aluminum nitride (AlN), and the upper mask layer 110b is made of titanium nitride (TiN), but the present invention is not limited to this.

Figure 2:
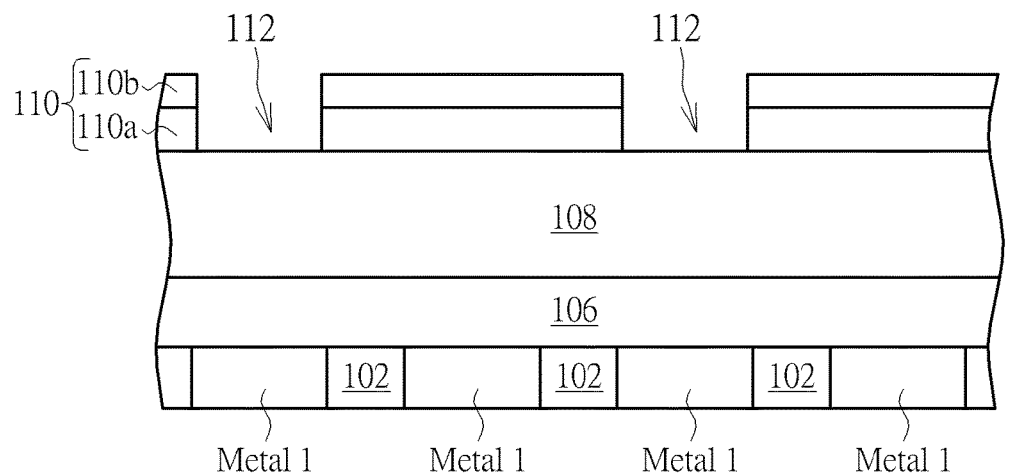

As shown in FIG. 2, a lithography step and an etching step are performed to remove part of the double mask layer 110 and define a first groove 112, where the first groove 112 may correspond to the position of a contact to be formed later. That is to say, the first groove 112 may continue to be etched in subsequent steps, and a contact structure may be formed at a position corresponding to the first groove 112, wherein the contact structure is electrically connected with the underlying first conductive layer Metal 1.

Figure 3:
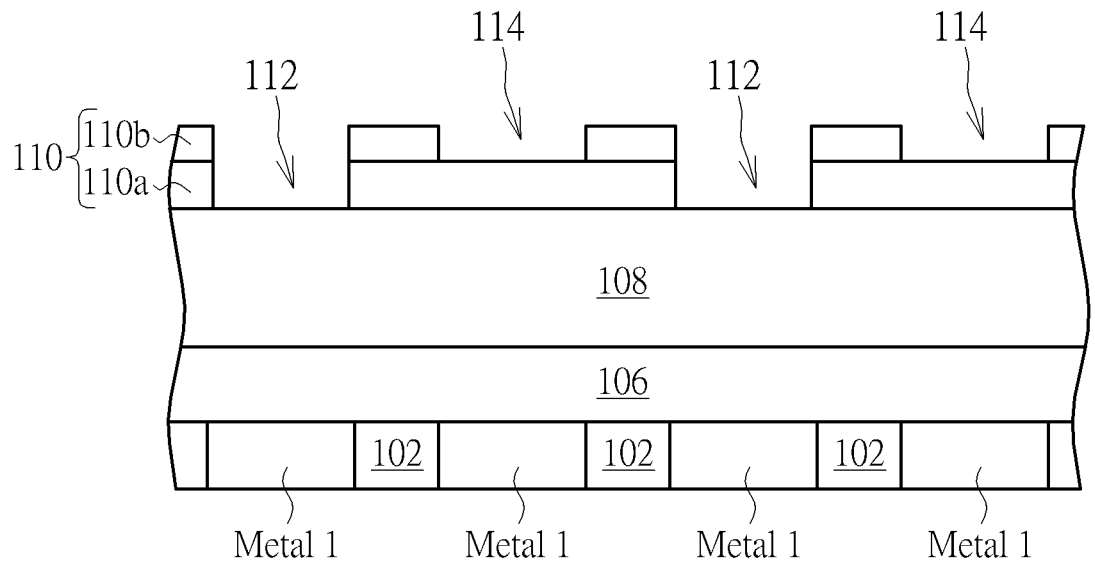

As shown in FIG. 3, another lithography step and another etching step are performed to remove part of the upper mask layer 110b of the double mask layer 110, but leave the lower mask layer 110a and define a second groove 114. It is worth noting that the second groove 114 described here may correspond to the position of a subsequently formed super via. That is, the second groove 114 may be etched continuously in the subsequent step, and a super via may be formed at the position corresponding to the second groove 114, in which the contact structure is electrically connected with the underlying first conductive layer Metal 1.

Figure 4:
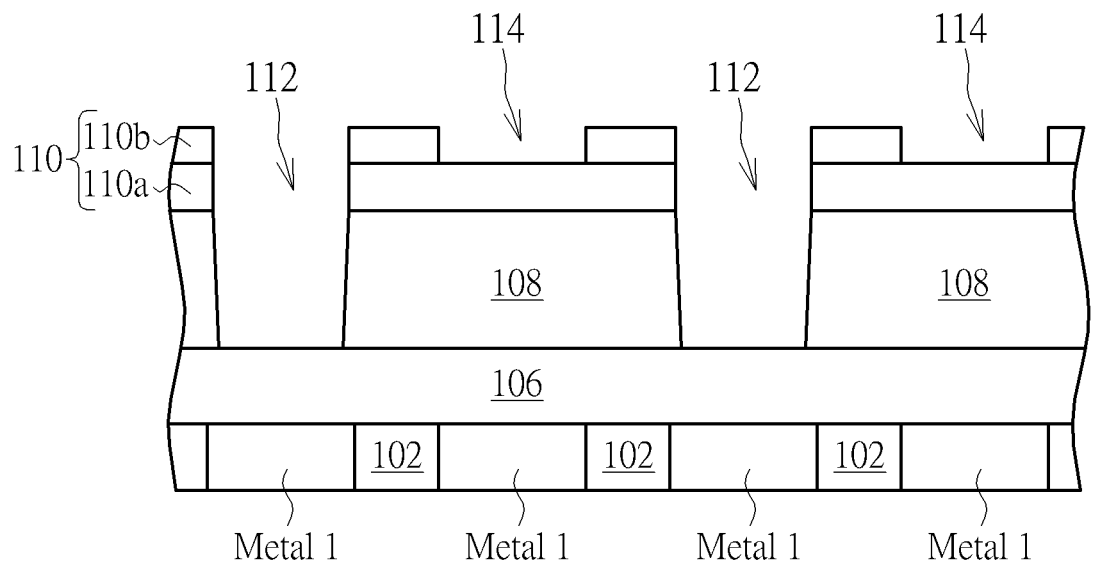
Figure 5:
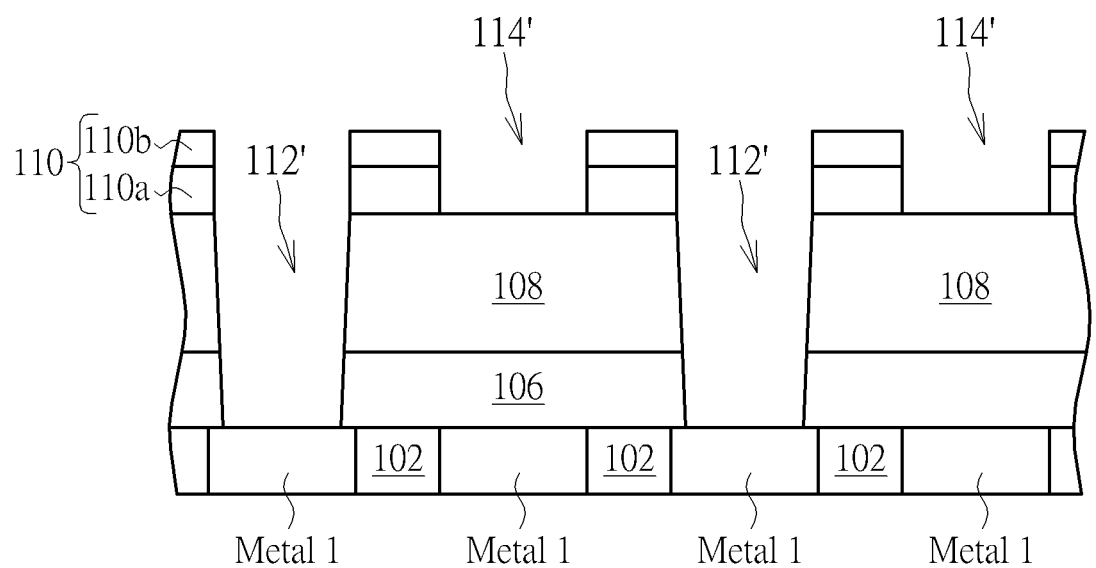

As shown in FIG. 4 to FIG. 5, the bottom of the first groove 112 and the second groove 114 are etched for at least two times or more to form the first groove 112' and the second groove 114', respectively. Taking this embodiment as an example, in the step of FIG. 4, part of the low-k dielectric layer 108 is removed by one etching step, but since the material of the low-k dielectric layer 108 and the etching stop layer 106 (such as AlN, but may also contain other materials, such as SiCN or SiOC, but not limited to this) has a sufficiently high etching selectivity, therefore, the etching stop layer 106 (made of AlN, for example) and the lower mask layer 110a (made of AlN, for example) are not removed in the etching step, and then in the step shown in FIG. 5, part of the etching stop layer 106 and the lower mask layer 110a are simultaneously removed in another etching step to form the first groove 112' and the second groove 114' shown in FIG. 5, respectively. The first groove 112' exposes a top surface of the first conductive layer Metal 1, and the second groove exposes a top surface of the low-k dielectric layer 108.

Figure 6:
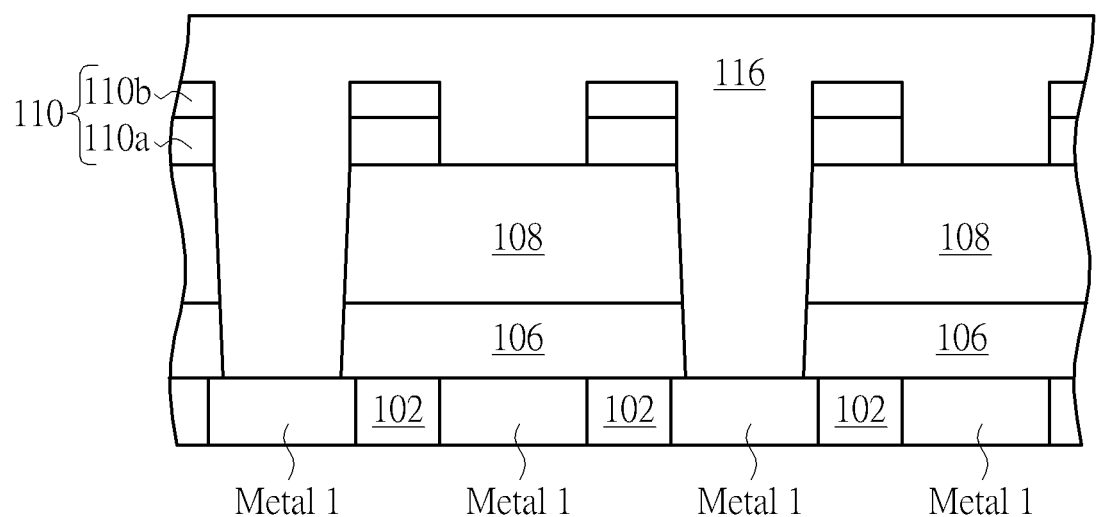
Figure 7:
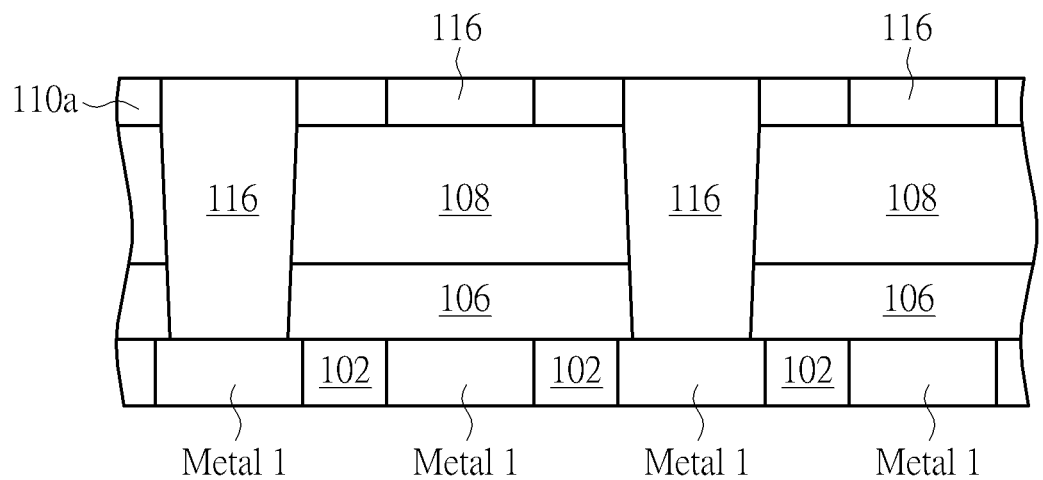

Next, as shown in FIG. 6 to FIG. 7, a conductive material layer 116 is completely filled in the first groove 112' and the second groove 114', where the conductive material layer 116 is, for example, the above-mentioned metal layer with good conductivity, such as tungsten, cobalt, copper and aluminum, but not limited to this. In some embodiments of the present invention, before the conductive material layer 116 is formed, a liner layer (not shown) may be formed under the conductive material layer 116 to improve the adhesion between the conductive material layer 116 and other materials. Then, as shown in FIG. 7, a planarization step is performed to remove part of the conductive material layer 116 and the upper mask layer 110b and expose the top surface of the lower mask layer 110a. The planarization step described here is, for example, chemical mechanical polishing (CMP), but is not limited to this. In addition, during the planarization step, the lower material layer 110a can be used as a stop layer.

Figure 8:
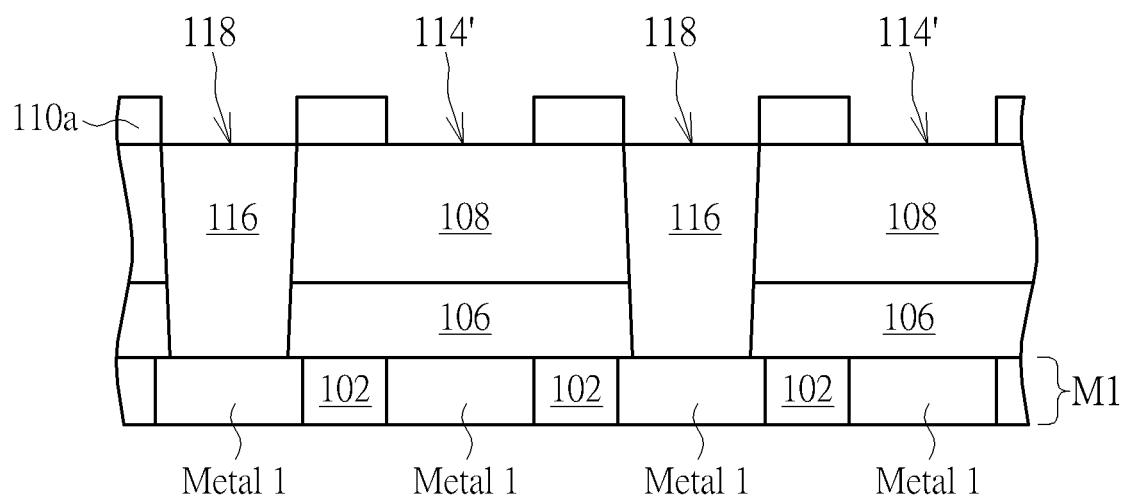

As shown in FIG. 8, an etching back step is performed to remove part of the conductive material layer 116, and the second groove 114' re-exposes the top surface of the low-k dielectric layer 108. It is worth noting that before the etching back step is performed, an oxidation step may be performed on the surface of the conductive material layer 116 to convert part of the conductive material layer 116 into a metal oxide layer, so as to improve the efficiency of the etching back step. Taking this embodiment as an example, the material selected for the conductive material layer 116 is copper, and before the etching back step is performed, part of the copper is oxidized by hydrogen peroxide to form copper oxide, which is easily removed in the etching back step. It can be understood that the present invention does not limit the need to perform the oxidation step before performing the etching back step. In other embodiments of the present invention, the etching back step can be performed directly without performing the oxidation step, which is also within the scope of the present invention.

After the step shown in FIG. 8 is completed, the conductive material layer 116 left in the first groove 112' is defined as a contact structure 118, the contact structure 118 is electrically connected with the underlying first conductive layer Metal 1, and the top surface of the contact structure 118 is lower than the top surface of the underlying mask layer 110a due to the etching back step. In addition, the contact structure 118 electrically connects the first conductive layer Metal 1 of the first inter-metal dielectric layer M1 and the second conductive layer Metal 2 of the second inter-metal dielectric layer M2 (located in the second inter-metal dielectric layer M2), and part of the contact structure 118 can be regarded as a part of the second conductive layer Metal 2 and a part of the via structure Via 1.

Figure 9:
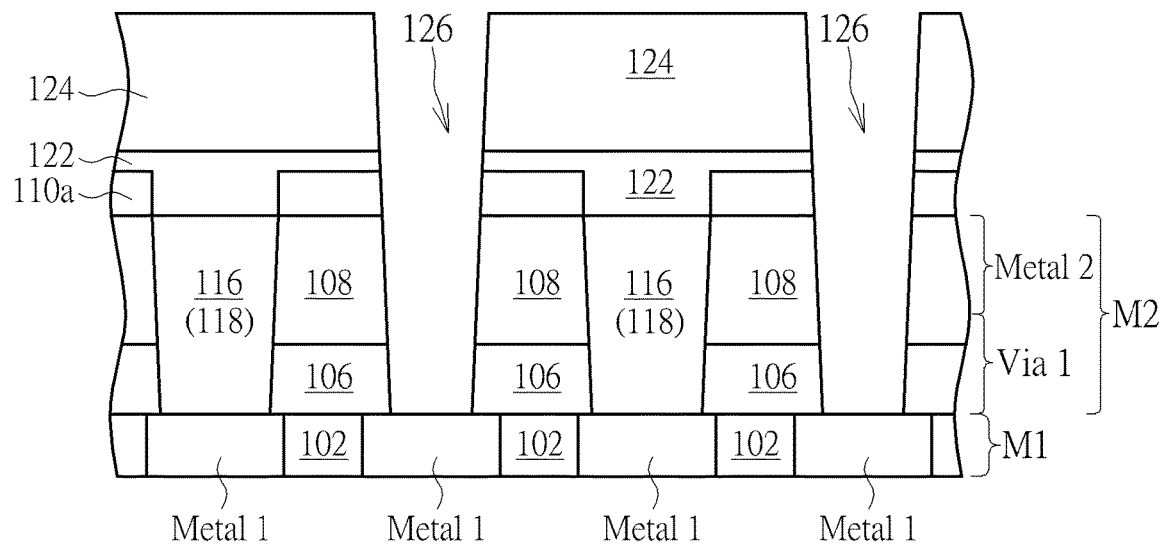

As shown in FIG. 9, a second etching stop layer 122 and a second low-k dielectric layer 124 are continuously formed, and corresponding to the original position of the second groove 114', one or more etching steps are performed to sequentially remove part of the second low-k dielectric layer 124, part of the second etching stop layer 122, part of the low-k dielectric layer 10 and part of the etching stop layer 106, until the underlying first conductive layer Metal 1 is exposed. The groove formed here (corresponding to the original position of the second groove 114') is redefined as the third groove 126. The sidewalls of the third groove 126 exposes the lower mask layer 110a of the second inter-metal dielectric layer M2.

Figure 10:
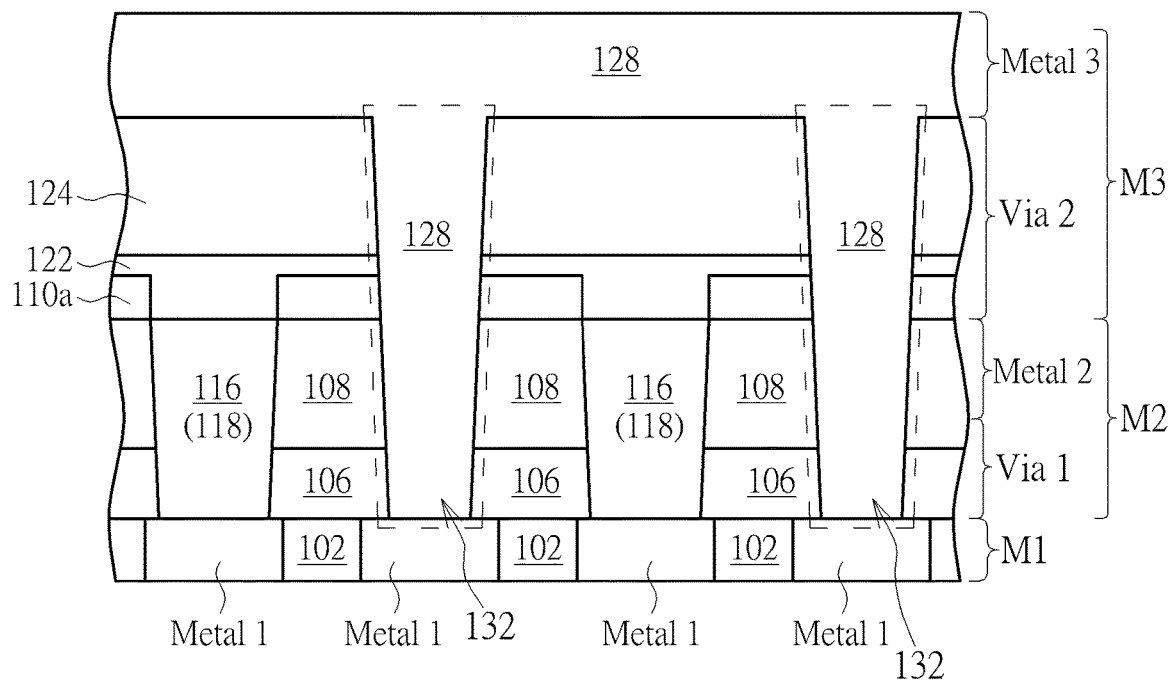

As shown in FIG. 10, a second conductive material layer 128 is filled into the third groove 126, and then a planarization step is performed to remove the extra second conductive material layer 128, and a third conductive layer Metal 3 is formed on top of the second low-k dielectric layer 124, the third conductive layer Metal 3 is electrically connected and directly contacted with the second conductive material layer 128. It is worth noting that since the third conductive layer Metal 3 and its surrounding dielectric layers (not shown in the Figure) are located above the first inter-metal dielectric layer M1 and the second inter-metal dielectric layer M2, so they can also be called the third inter-metal dielectric layer M3. In addition, a via structure Via 2 may also be formed in the second etching stop layer 122 and the second low-k dielectric layer 124. As the cross-sectional view in FIG. 10 does not pass through the via structure Via 2, the via structure Via 2 is not shown, but it can be understood that the via structure Via 2 is located in the second etching stop layer 122 and the second low-k dielectric layer 124, and the via structure Via 2 electrically connects the second conductive layer Metal 2 and the third conductive layer Metal 3.

In addition, after filling the second conductive material layer 128 into the third groove 126 and performing the planarization step, the second conductive material layer 128 left in the third groove 126 is defined as a super via 132. Unlike the via structure Via 1 or via structure Via 2 described above, the super via 132 can achieve the electrical connection across the inter-metal dielectric layers. For example, in this embodiment, the super via 132 electrically connects the third conductive layer Metal 3 of the third inter-metal dielectric layer M3 with the first conductive layer Metal 1 of the first inter-metal dielectric layer M1, and skipping the second conductive layer Metal 2 of the second inter-metal dielectric layer M2 (not electrically connected with the second conductive layer Metal 2)

It is worth noting that the super via 132 in this embodiment is formed by a self-alignment method (refer to the contents of FIGS. 5-10), so the via position alignment is more accurate and compatible with the existing process. In addition, although the super via 132 in this embodiment is not electrically connected to the second conductive layer Metal 2 of the second inter-metal dielectric layer M2, the super via 132 will contact the lower mask layer 110a in the second inter-metal dielectric layer M2. The lower mask layer 110a contacts both side walls of the super via 132, which can enhance the structural stability of the super via 132 (prevent the super via 132 from collapsing due to its high aspect ratio) and prevent metal atoms (such as copper atoms) in the super via 132 from diffusing. In addition, in some embodiments, since the super via 132 and the third conductive layer Metal 3 are formed at the same time, the super via 132 and the third conductive layer Metal 3 may have an integrally formed structure, but are not limited to this.

Figure 11:
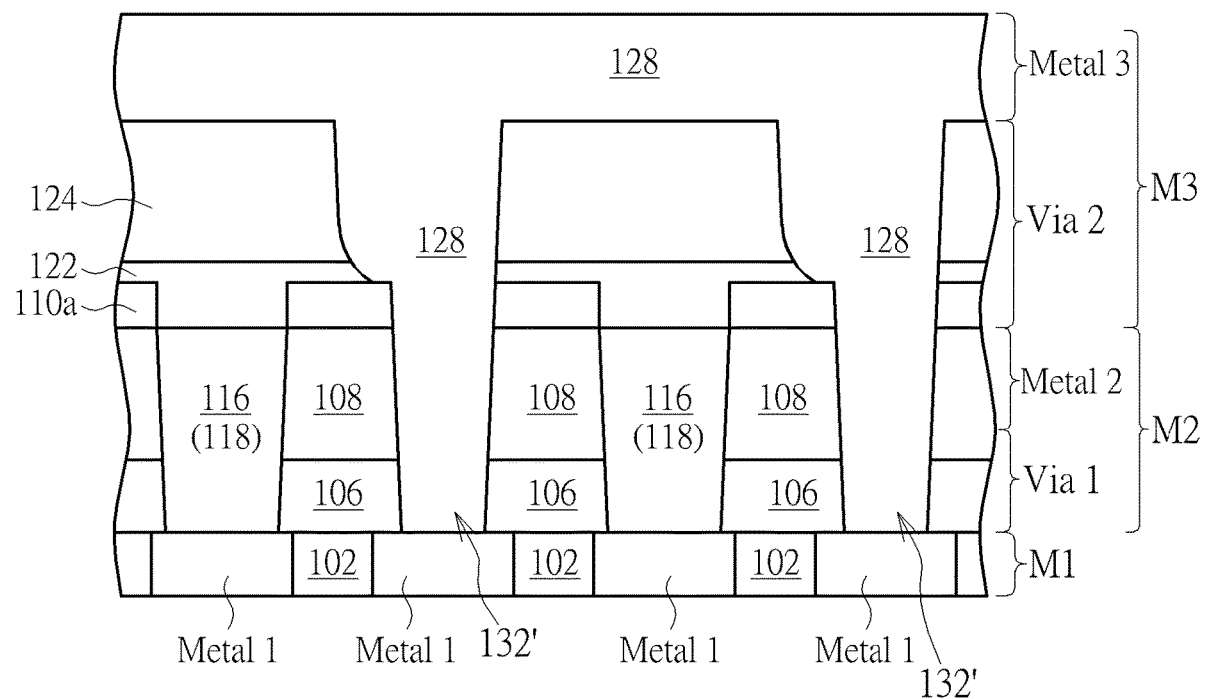
FIG. 11 is a schematic cross-sectional view of a semiconductor structure according to another embodiment of the present invention.

In addition, in this embodiment, both sidewalls of the super via 132 contact the lower mask layer 110a, and the lower mask layer 110a may also constraint the formation position of the super via 132. In other words, since the super via 132 needs to pass through the hole of the lower mask layer 110a (that is, the gap between adjacent lower mask layers 110a in the Figure) before it can be electrically connected with the lower first conductive layer Metal 1, the lower mask layer 110a can also avoid the problems of mis-alignment caused by inaccurate alignment and shorting issue caused by contacting other elements when forming the super via 132. For example, as shown in FIG. 11, which shows a schematic cross-sectional view of a semiconductor structure according to another embodiment of the present invention, FIG. 11 includes at least one offset super via 132'. During the formation of the super via 132', the super via 132' is not aligned with the lower first conductive layer Metal 1 due to an error caused by the alignment step or exposure. However, since the lower mask layer 110a limits and determines the position of the super via 132', the super via 132' can still contact and electrically connect with the first conductive layer Metal 1 after passing through the lower mask layer 110a, without contacting other elements and causing shorting issue. In more detail, this method is also called "fully self-alignment via (FSAV)" method. In the manufacturing process of the super via 132', it will be constrained by the pattern from the third conductive layer Metal 3 and the additional constraint given by the lower mask layer 110a. However, due to the restriction effect of these two different directions, the super via 132' has a more accurate alignment performance.

In addition, the applicant found that in the process of this embodiment, the AlN material used for the lower mask layer 110a can achieve additional advantages. When the AlN material is covered on the low-k dielectric layer, it is beneficial to improve the compatibility between interfaces and improve the reliability of TDDB (Time Dependent Dielectric Breakdown) test, thus improving the quality of semiconductor devices.

To sum up, the invention provides a semiconductor structure with a super via and a manufacturing method thereof. The semiconductor structure formed by the process of the invention includes a super via which is electrically connected with wire layers or conductive structures of upper and lower inter-metal dielectrics, and skips the wire layer or conductive structure of at least one inter-metal dielectric layer in the middle (for example, electrically connecting the first conductive layer of the first inter-metal dielectric layer M1 with the third conductive layer of the third inter-metal dielectric layer M3, while skipping the second conductive layer in the second inter-metal dielectric layer M2) In addition, the super via formed by self-alignment includes at least one mask layer contacting the super via in the middle section, which can be used as a supporting structure and can avoid the problems of atom diffusion and poor alignment. Therefore, the semiconductor structure with super vias and the manufacturing method thereof provided by the present invention have better device quality and process yield.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A semiconductor structure, comprising:
    a substrate;
    a first inter-metal dielectric layer, a second inter-metal dielectric layer and a third inter-metal dielectric layer sequentially arranged on the substrate, wherein the first inter-metal dielectric layer comprises at least one first conductive layer, the third inter-metal dielectric layer comprises at least one mask layer and at least one third conductive layer; and
    a super via penetrating through the second inter-metal dielectric layer electrically connects the first conductive layer and the third conductive layer, and parts of the super via directly contacts the at least one mask layer in the third inter-metal dielectric layer, wherein the at least one mask layer contacts both sidewalls of the super via.

2. The semiconductor structure according to claim 1, wherein the at least one mask layer comprises aluminum nitride (AlN).

3. The semiconductor structure according to claim 1, wherein the second inter-metal dielectric layer comprises at least one second conductive layer.

4. The semiconductor structure according to claim 3, further comprising a contact structure located above the first inter-metal dielectric layer and electrically connecting the second conductive layer and the first conductive layer.

5. The semiconductor structure according to claim 4, wherein a top surface of the contact structure is lower than a top surface of the at least one mask layer.

6. The semiconductor structure according to claim 1, wherein the at least one mask layer in the third inter-metal dielectric layer directly contacts the sidewall of the super via.

7. A manufacturing method of a semiconductor structure, comprising:
    providing a substrate;
    forming a first inter-metal dielectric layer, a second inter-metal dielectric layer and a third inter-metal dielectric layer sequentially on the substrate, wherein the first inter-metal dielectric layer comprises at least one first conductive layer, the third inter-metal dielectric layer comprises at least one mask layer and at least one third conductive layer; and
    forming a super via penetrating through the second inter-metal dielectric layer to electrically connect the first conductive layer and the third conductive layer, and parts of the super via directly contacts the at least one mask layer in the third inter-metal dielectric layer, wherein the at least one mask layer contacts both sidewalls of the super via.

8. The method according to claim 7, further comprising forming an etching stop layer, a low-k dielectric layer and the at least one mask layer to be a double mask layer on the first inter-metal dielectric layer after the first inter-metal dielectric layer is formed.

9. The method according to claim 8, wherein the double mask layer comprises a lower mask layer and an upper mask layer, wherein the material of the lower mask layer comprises AlN and the material of the upper mask layer comprises TiN.

10. The method according to claim 9, further comprising performing multiple etching steps to partially etch the double mask layer, the etching stop layer and the low-k dielectric layer to form a first groove and a second groove, wherein the first groove exposes a top surface of the first conductive layer and the second groove exposes a top surface of the low-k dielectric layer.

11. The method according to claim 10, further comprising filling a conductive layer into the first groove to form a contact structure, and forming a second conductive layer on the contact structure and electrically connecting the contact structure.

12. The method according to claim 11, further comprising performing a planarization step to remove the upper mask layer.

13. The method of claim 12, further comprising forming a second etching stop layer and a second low-k dielectric layer on the lower mask layer and the second conductive layer.

14. The method according to claim 13, further comprising performing an etching step to remove part of the second low-k dielectric layer, part of the second etching stop layer, part of the low-k dielectric layer and part of the etching stop layer to form a third groove exposing the first conductive layer.

15. The method according to claim 13, wherein the sidewall of the third groove exposes the at least one mask layer in the third inter-metal dielectric layer.

16. The method according to claim 13, further comprising filling a second conductive layer into the third groove to form the super via.

17. The method according to claim 7, wherein the at least one mask layer in the third inter-metal dielectric layer directly contacts the sidewall of the super via.

* * * * *